United States Patent [19]

Kaneko

[11] Patent Number: 5,677,211
[45] Date of Patent: Oct. 14, 1997

[54] METHOD FOR MANUFACTURING A THIN FILM TRANSISTOR

[75] Inventor: Wakahiko Kaneko, Tokyo, Japan

[73] Assignee: NEC Corporation, Tokyo, Japan

[21] Appl. No.: 626,072

[22] Filed: Apr. 1, 1996

[30] Foreign Application Priority Data

Mar. 31, 1995 [JP] Japan .................................. 7-075131

[51] Int. Cl.⁶ .................................................. H01L 21/86
[52] U.S. Cl. ........................ 437/40 TFI; 437/41 TFI; 437/937
[58] Field of Search ................ 437/40 TFI, 41 TFI, 437/40 TFT, 41 TFT, 937, 913, 101; 148/DIG. 150, DIG. 1

[56] References Cited

U.S. PATENT DOCUMENTS

| | | | |
|---|---|---|---|
| 4,704,783 | 11/1987 | Possin et al. | 148/DIG. 1 |
| 4,797,108 | 1/1989 | Crowther | 437/41 TFI |
| 4,823,180 | 4/1989 | Wieder et al. | 257/290 |
| 5,264,710 | 11/1993 | Yamagishi et al. | 437/101 |
| 5,281,546 | 1/1994 | Possin et al. | 437/937 |

FOREIGN PATENT DOCUMENTS 60-117690  6/1985  Japan .

*Primary Examiner*—Michael Trinh
*Attorney, Agent, or Firm*—Whitham, Curtis, Whitham & McGinn

[57] ABSTRACT

In a method for manufacturing a thin film transistor, an upper portion of a channel region of an a—Si active layer is selectively etched using the source electrode and the drain electrode as a mask, so as to form a recess in the upper portion of the channel region of the active layer. Hydrogen plasma is irradiated to an exposed surface including a surface of the active layer, and succeedingly, an amorphous silicon film is deposited on the exposed surface including the surface of the active layer, and then patterned so as to form a light block film which also acts a protection layer.

2 Claims, 2 Drawing Sheets

METHOD FOR MANUFACTURING A THIN FILM TRANSISTOR

BACKGROUND OF THE INVENTION

1. Field of the Invention

The present invention relates to a method for manufacturing a thin film transistor, and more specifically a method for manufacturing a thin film transistor used for driving an active matrix liquid crystal display.

2. Description of Related Art

Referring to FIG. 1, there is shown a diagrammatic sectional view of a conventional thin film transistor. As shown in FIG. 1, the conventional thin film transistor includes a transparent insulating substrate 1 such as a glass plate, having a gate electrode 2 formed thereon. A gate insulating film 3 is formed to cover a surface of the transparent insulating substrate 1 and the gate electrode 2 formed thereon. In addition, an amorphous silicon film (called an "a—Si film" hereinafter) 4 and a phosphorus doped n+ a—Si film 5 are deposited on the gate insulating film 3 in the named order, and then, is patterned to form an active layer in an island form.

Thereafter, a metal film is deposited on an exposed surface including the active layer thus formed, and then, is patterned so as to form a source electrode 6 and a drain electrode 7. In addition, by using the source electrode 6 and a drain electrode 7 as a mask, the n+ a—Si film 5 is selectively removed by etching, so as to from a recess in a channel region of the active layer.

Furthermore, on an exposed surface including the Si film 4, the source electrode 6 and the drain electrode 7, an insulating protection film 10 such as a silicon nitride film and a light block film 11 are deposited in the named order, and then, are patterned to complete a thin film transistor.

The above mentioned process is disclosed by, for example, Japanese Patent Application Laid-open Publication No. JP-A-60-117690.

Generally, a recessed channel type thin film transistor as mentioned above has a problem in which, a surface of the channel region after the recess has been formed, is very sensitive, and a condition of the channel region surface gives a large influence on a characteristics of the thin film transistor. Therefore, the conventional thin film transistor has the insulating protection film such as the silicon nitride film, which is deposited on a boundary surface of the etched channel region, for the purpose of protecting the recessed channel region surface. In addition, since the thin film transistor is also sensitive to light, the light block film 11 formed of for example an a—Si film is deposited on the insulating protection film.

However, in the conventional thin film transistor, since the insulating protection film and the light block film are deposited and stacked on the channel region of the active layer, two film deposition steps, two photolithographic steps and two etching steps are required, which are a large load in a manufacturing process.

SUMMARY OF THE INVENTION

Accordingly, it is an object of the present invention to provide a method for manufacturing a thin film transistor, which has overcome the above mentioned defect of the conventional one.

Another object of the present invention is to provide a method for manufacturing a thin film transistor, in which the protection film forming step and the light block film form step are simplified so as to reduce the cost of the thin film transistor.

The above and other objects of the present invention are achieved in accordance with the present invention by a method for manufacturing a thin film transistor, the method including the steps of:

forming a gate insulator film on a surface of a transparent insulating substrate including a gate electrode formed on the surface of the transparent insulating substrate;

depositing a first amorphous silicon film on the gate insulator film, and patterning the deposited first amorphous silicon film so as to form an active layer;

depositing a metal layer on an exposed surface including a surface of the active layer, and patterning the deposited metal layer so as to form a source electrode and a drain electrode which are in ohmic contact with the active layer;

selectively etching an upper portion of a channel region of the active layer using the source electrode and the drain electrode as a mask, so as to form a recess in the upper portion of the channel region of the active layer; and irradiating hydrogen plasma to an exposed surface including a surface of the active layer, depositing a second amorphous silicon film on the exposed surface including the surface of the active layer, and patterning the deposited second amorphous silicon film so as to form a protection and light block film for blocking the light which would otherwise inter into the channel region of the active layer, According to a second aspect of the present invention, there is provided a method for manufacturing a thin film transistor, the method including the steps of:

forming a gate insulator film on a surface of a transparent insulating substrate including a gate electrode formed on the surface of the transparent insulating substrate;

depositing a first amorphous silicon film on the gate insulator film, and patterning the deposited first amorphous silicon film so as to form an active layer;

depositing a metal layer on an exposed surface including a surface of the active layer, and patterning the deposited metal layer so as to form a source electrode and a drain electrode which are in ohmic contact with the active layer;

selectively etching an upper portion of a channel region of the active layer using the source electrode and the drain electrode as a mask, so as to form a recess in the upper portion of the channel region of the active layer; and depositing on the exposed surface including the surface of the active layer, a second amorphous silicon film having a defect of greater than $2 \times 10^{16}$ cm$^{-3}$ in an ESR (Electron Spin Resonance) density, by a plasma CVD process using a SiH4 gas and a H2 gas, and patterning the deposited second amorphous silicon film so as to form a protection and light block film for blocking the light which would otherwise inter into the channel region of the active layer.

As seen from the above, according to the present invention, on the channel region on of the active layer, there is provided the amorphous silicon film which acts not only as the protection film but also as the light block layer. Therefore, the manufacturing process is greatly simplified or shortened. In this connection, it can be generally said that, depending upon a film quality of the amorphous silicon film provided as the light block film, a leak current occurs in a boundary between the amorphous silicon film and the channel region of the active layer, with the result that the operating characteristics of the thin film transistor is deteriorated.

However, according to the first aspect of the present invention, just before the amorphous silicon film for the protection and light block layer is deposited, the surface of the channel region of the active layer is treated by exposing it to hydrogen plasma which is generated by applying a radio frequency electric field to hydrogen in vacuum. The leak current can be minimized by this treatment.

Alternatively, according to the second aspect of the present invention, a similar effect can be obtained by depositing the amorphous silicon film for the protection and light block layer, in such a manner as to cause the deposited amorphous silicon film to have a film quality including a defect of greater than $2 \times 10^{16}$ cm$^{-3}$ in an ESR (Electron Spin Resonance) density.

The above and other objects, features and advantages of the present invention will be apparent from the following description of preferred embodiments of the invention with reference to the accompanying drawings.

DESCRIPTION OF THE PREFERRED EMBODIMENTS

Figure 1:
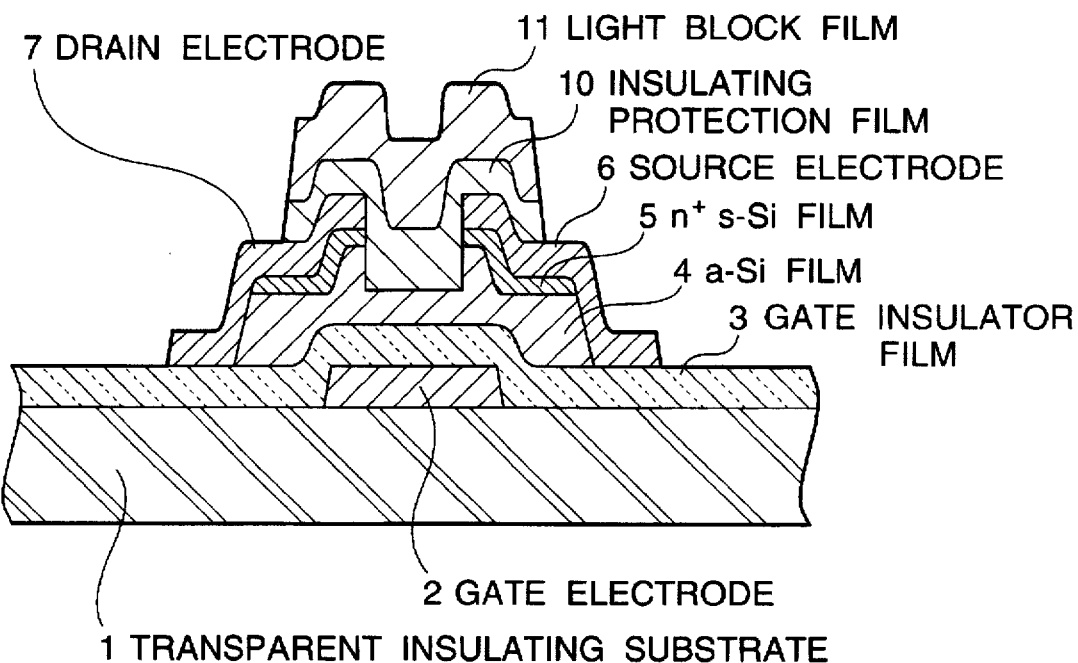
FIG. 1 is a diagrammatic sectional view of a conventional thin film transistor manufactured by a prior art process for manufacturing a thin film transistor.
Figure 2:
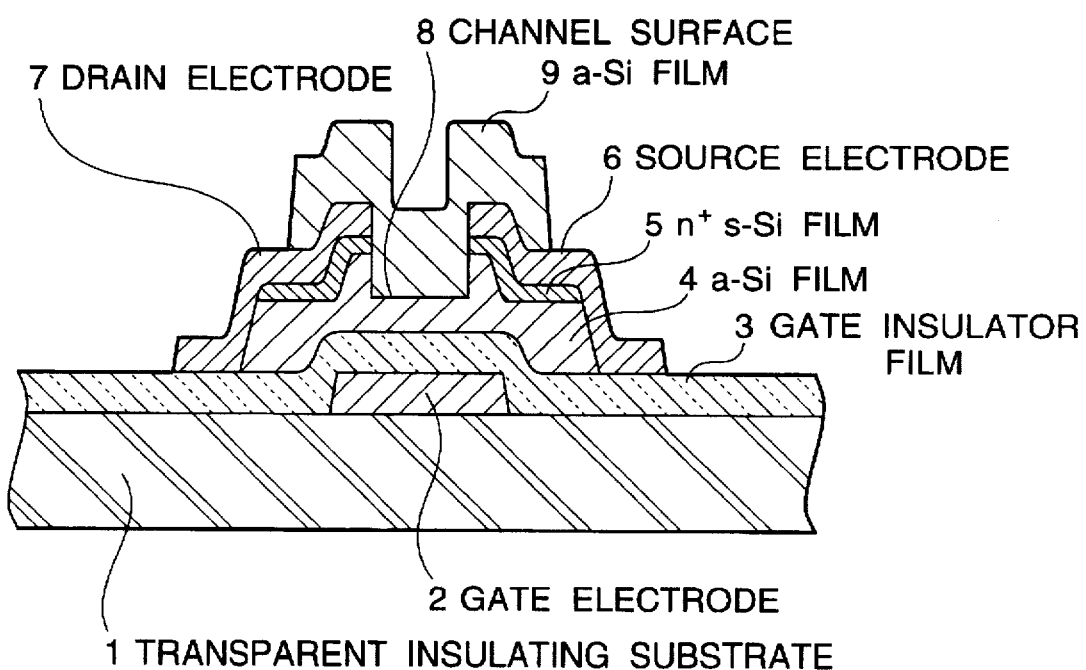
FIG. 2 is a diagrammatic sectional view of a thin film transistor manufactured by one embodiment of a process in accordance with the present invention for manufacturing a thin film transistor.

Referring to FIG. 2, there is shown a diagrammatic sectional view of a thin film transistor manufactured by one embodiment of a process in accordance with the present invention for manufacturing a thin film transistor. In FIG. 2, elements similar to those shown in FIG. 1 are given the same Reference Numerals.

As shown in FIG. 2, in one embodiment of a process in accordance with the present invention for manufacturing a thin film transistor, a chromium film having a thickness of 100 nm is formed on a transparent insulating substrate 1 formed of a low alkaline glass having a thickness of 1 mm, by means of a sputtering, and then, is patterned to form a gate electrode 2 on the transparent insulating substrate 1. Then, a gate insulator film 3 is formed by depositing a silicon nitride film having a thickness of 500 nm on a surface of the transparent insulating substrate 1 including the gate electrode 1, by means of a plasma CVD process. Further, on the gate insulator film 3, an a—Si film 4 having a thickness of 100 nm and a phosphorus doped n$^+$ a—Si film 5 having a thickness of 60 nm are deposited, step by step, in the named order also by means of a plasma CVD process. Then, the n$^+$ a—Si film 5 and the a—Si film 4 are selectively etched, step by step, in the named order so as to form an active layer in an island form which is positioned directly above the gate electrode 2.

Thereafter, a chromium film having a thickness of 200 nm is deposited by a sputtering on an exposed surface including the active layer, and then, is patterned so as to form a source electrode 6 and a drain electrode 7 which are in ohmic contact with the a—Si film 4 through the n$^+$ a—Si film 5.

In addition, by using the source electrode 6 and the drain electrode 7 as a mask, the n$^+$ a—Si film 5 and an upper portion of the a—Si film 4 are selectively etched to a depth of about 150 nm, so that a recess is formed in a channel region of the active layer directly above the gate electrode 2.

Next, a hydrogen plasma is generated under the condition in which the flow rate of a H2 gas is 100 sccm, the pressure is 100 Pa, a radio frequency power is 0.05 W/cm$^2$, the electrode distance is 40 mm, and the substrate temperature is 250° C., and the generated hydrogen plasma is irradiated to an exposed surface 8 (in the recess) of the channel region of the a—Si film 4 about ten seconds. Succeedingly, an a—Si film 9 having the thickness of 400 nm is deposited on the surface including the exposed surface 8 of the a—Si film 4, by a plasma CVD process. The deposited a—Si film 9 is patterned so as to form a protection and light block film for the channel region of the thin film transistor.

Figure 3:
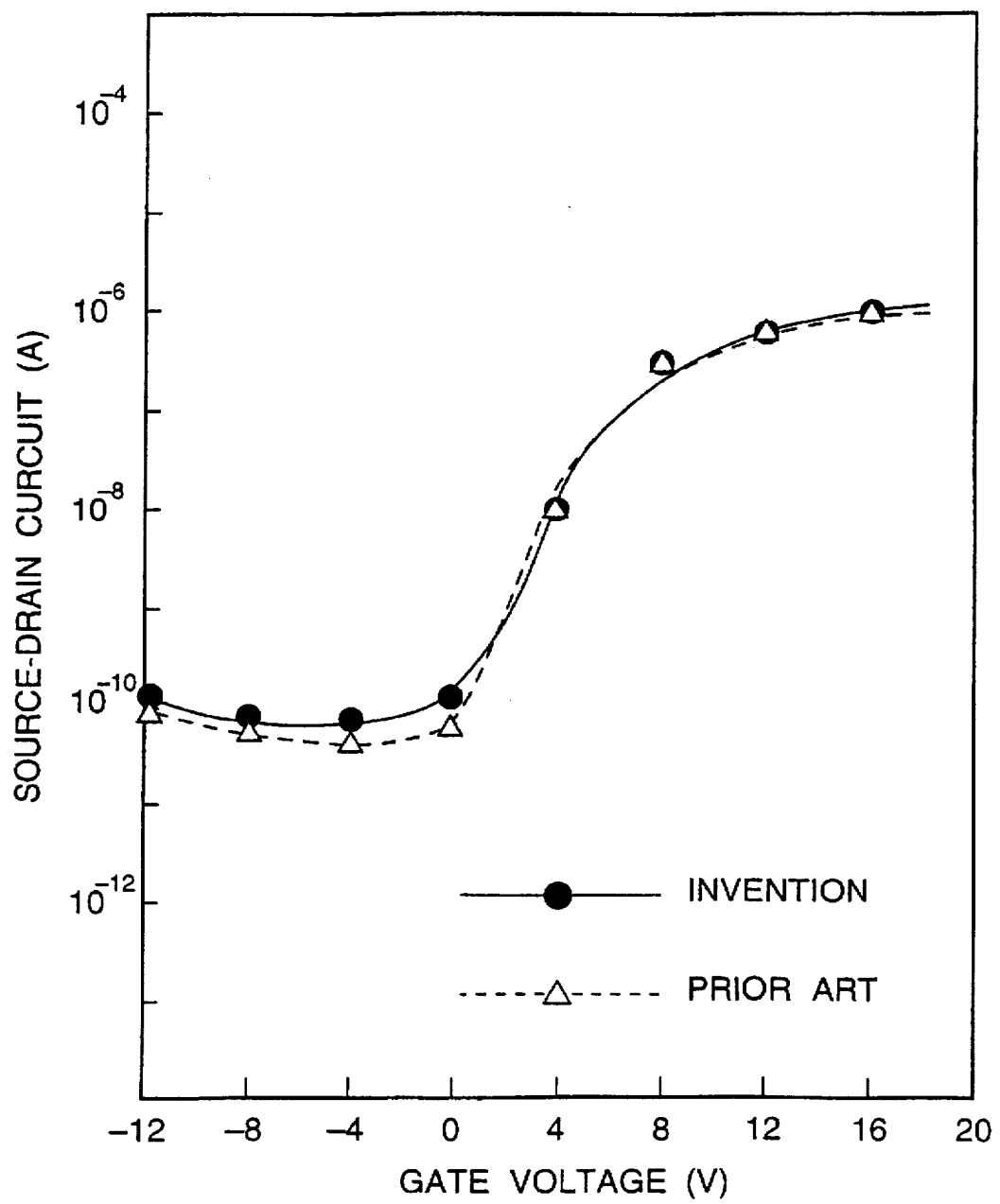
FIG. 3 is a graph illustrating an operating characteristics of the thin film transistor manufactured by the prior art manufacturing process and an operating characteristics of the thin film transistor manufactured by one embodiment of the manufacturing process in accordance with the present invention.

An operating characteristics of the thin film transistor thus formed in accordance with the present invention is shown by a solid line in FIG. 3. In addition, a dotted line in FIG. 3 shows an operating characteristics of the prior art thin film transistor having the insulating protection film and the amorphous silicon light block film individually formed and stacked on the insulating protection film. The thin film transistor formed in accordance with the present invention has substantially the same operating characteristics as that of the prior art thin film transistor. But, the manufacturing process of the present invention is shortened about 15% in comparison with the prior art process for manufacturing the prior art thin film transistor having the insulating protection film and the amorphous silicon light block film individually formed and stacked on the insulating protection film.

As an alternative of irradiating the hydrogen plasma onto the channel surface of the a—Si film 4 and then depositing the a—Si film 9 by the plasma CVD process, the protection and light block film can be formed by depositing on the surface of the a—Si film 4 in the channel region, an a—Si fill having a defect of greater than $2 \times 10^{16}$ cm$^{-3}$ in an ESR density, by a plasma CVD process under a condition that the flow rate ratio of SiH4:H2 is 1:20, the pressure is 60 Pa, a radio frequency power is 0.1 W/cm$^2$. Thereafter, the deposited a—Si film is patterned to finish the protection and light block film.

This second embodiment has an operating characteristics similar to that of the first embodiment.

As seen from the above, the present invention can shorten the manufacturing process without lowering the operating characteristics of the finished thin film transistor, by forming on the channel region of the active layer the amorphous silicon film which acts not only as the protect film but also as the light block layer. Therefore, the manufacturing cost of the thin film transistor can be reduced without lowering the operating characteristics of the thin film transistor.

The invention has thus been shown and described with reference to the specific embodiments. However, it should be noted that the present invention is in no way limited to the details of the illustrated structures but changes and modifications may be made within the scope of the appended claims.

What is claimed is:

1. A method for manufacturing a thin film transistor, the method including the steps of:

forming a gate insulator film on a surface of a transparent insulating substrate including a gate electrode formed on said surface of said transparent insulating substrate;

depositing a first amorphous silicon film on said gate insulator film, and patterning the deposited first amorphous silicon film so as to form an active layer;

depositing a metal layer on an exposed surface including a surface of said active layer, and patterning the deposited metal layer so as to form a source electrode and a drain electrode which are in ohmic contact with said active layer;

selectively etching an upper portion of a channel region of said active layer using said source electrode and said drain electrode as a mask, so as to form a recess in said upper portion of said channel region of said active layer; and irradiating hydrogen plasma to an exposed surface including a surface of said etched active layer, depositing a second amorphous silicon film on said exposed surface including said surface of said irradiated active layer, and patterning the deposited second amorphous silicon film so as to form a protection and light block film for blocking light which would otherwise enter into said channel region of said active layer.

2. A method claimed in claim 1 wherein said hydrogen plasma is generated under a condition in which a flow rate of a $H_2$ gas is 100 sccm, a pressure is 100 Pa, a radio frequency power is 0.05 W/cm$^2$, an electrode distance is 40 mm, and a substrate temperature is 250° C., and a generated hydrogen plasma is irradiated to said exposed surface including said surface of said etched active layer about ten seconds.

* * * * *